(12) United States Patent
Stahr et al.

(10) Patent No.: US 8,398,775 B2
(45) Date of Patent: Mar. 19, 2013

(54) ELECTRODE AND ARRANGEMENT WITH MOVABLE SHIELD

(75) Inventors: Frank Stahr, Arnsdorf (DE); Ulf Stephan, Dresden (DE); Olaff Steinke, Radeberg (DE); Klaus Schade, Moritzburg (DE)

(73) Assignee: Applied Materials, Inc., Santa Clara, CA (US)

( * ) Notice: Subject to any disclaimer, the term of this patent is extended or adjusted under 35 U.S.C. 154(b) by 478 days.

(21) Appl. No.: 11/937,137

(22) Filed: Nov. 8, 2007

(65) Prior Publication Data
US 2009/0121604 A1     May 14, 2009

(30) Foreign Application Priority Data
Nov. 8, 2007   (WO) ................. PCT/EP2007/062084

(51) Int. Cl.
C23C 16/50 (2006.01)
C23C 16/00 (2006.01)
C23F 1/00 (2006.01)
H01L 21/306 (2006.01)

(52) U.S. Cl. ..... 118/729; 118/715; 118/728; 156/345.1; 156/345.33; 156/345.34; 156/345.51; 156/345.54

(58) Field of Classification Search ............... 118/715, 118/720, 721, 728, 729; 156/345.1, 345.11, 156/345.19, 345.3, 345.34, 345.43, 345.47, 156/345.51, 345.54
See application file for complete search history.

(56) References Cited

U.S. PATENT DOCUMENTS

| | | | | |
|---|---|---|---|---|
| 5,399,254 A | * | 3/1995 | Geisler et al. | 204/298.31 |
| 5,651,867 A | * | 7/1997 | Kokaku et al. | 204/298.25 |
| 6,527,911 B1 | * | 3/2003 | Yen et al. | 156/345.43 |
| 2002/0076490 A1 | * | 6/2002 | Chiang et al. | 427/248.1 |
| 2002/0127853 A1 | * | 9/2002 | Hubacek et al. | 438/689 |
| 2004/0221808 A1 | * | 11/2004 | Kawano | 118/715 |
| 2004/0231799 A1 | * | 11/2004 | Lee et al. | 156/345.34 |
| 2005/0263484 A1 | | 12/2005 | Park et al. | |

FOREIGN PATENT DOCUMENTS

| | | |
|---|---|---|
| DE | 3918256 | 6/1989 |
| DE | 4109619 C1 | 8/1992 |
| DE | 10010016 | 1/2002 |
| EP | 0109148 A | 5/1984 |
| WO | WO 99/61675 A | 12/1999 |
| WO | WO 2007/035050 A | 3/2007 |

OTHER PUBLICATIONS

PCT International Preliminary Report on Patentability; International Application No. PCT/US2007/062084, mailed May 11, 2010, 6 pages.

* cited by examiner

*Primary Examiner* — Parviz Hassanzadeh
*Assistant Examiner* — Tiffany Nuckols
(74) *Attorney, Agent, or Firm* — Kilpatrick Townsend & Stockton LLP

(57) ABSTRACT

The present invention comprises an electrode arrangement for a coating device with a stationary first electrode (3) and a second movable electrode (18), whose principle surfaces are opposing each other during coating, wherein the second electrode (18) may be moved along a plane parallel to the opposing principle surfaces, wherein at least one end face of an electrode running transversely to the principal surface an electrical shield (12, 19, 13) is provided, which extends at least partially parallel to the end face of one electrode, wherein at least one part (14) of the shield is formed so as to be movable.

22 Claims, 1 Drawing Sheet

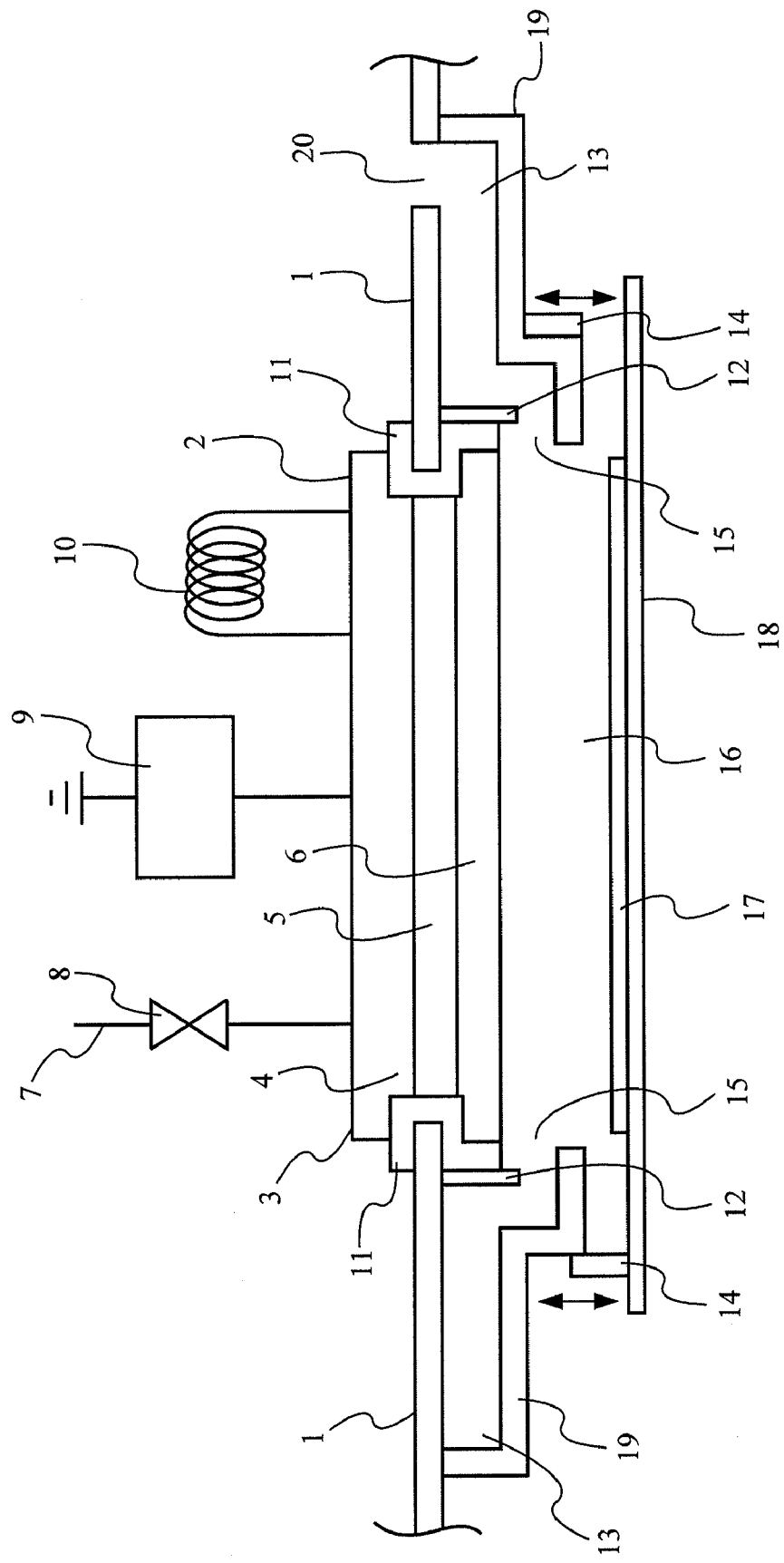

ELECTRODE AND ARRANGEMENT WITH MOVABLE SHIELD

BACKGROUND OF THE INVENTION

1. Field of the Invention

The present invention relates to an electrode arrangement for a coating device with a fixed first electrode and a second movable electrode, whose principle surfaces are opposite each other, wherein the second electrode may be moved along a plane parallel to the opposite principle surfaces.

Moreover, the present invention relates to a corresponding coating device for use in plasma-enhanced chemical vapour phase deposition with a corresponding electrode arrangement.

2. Prior Art

Plasma enhanced chemical vapour deposition (PECVD) is known from the prior art and is widely employed in different applications for coating or modifying surfaces. For applications involving the coating of architectural glazing and also the manufacture of thin-layer solar cell modules, it is necessary to apply large-surface coatings of very high quality in terms of the homogeneity of the applied coating.

To be able to effect a corresponding homogeneous coating, it is necessary that, especially where the electrodes have large surface areas, the conditions or properties with respect to the electrodes are homogeneous across the electrode surfaces. This applies not only to the potential distribution or the distribution of the electric field, but also to the temperature distribution and the distribution of the materials in the form of reaction gases that are needed for the chemical vapour phase deposition.

Accordingly, the use of so-called showerhead electrodes is known from the prior art wherein the electrode surface has a plurality of outlet openings through which gaseous reaction substances can be introduced into the coating space or, in the case of corresponding plasma-enhanced CVD coating, into the plasma space. This ensures that the gaseous reaction products are distributed over the electrode surfaces and thus over the coating surface as uniformly and thus as homogeneously as possible.

For the purpose of uniform temperature distribution at the electrodes, the prior art also provides corresponding heating and/or cooling devices by means of which a homogeneous temperature distribution can be set at the electrodes. However, in connection with showerhead electrodes, problems arise, namely the provision of corresponding gas distribution spaces is observed to lead to poor temperature conduction in the electrode.

For the purpose of obtaining a homogeneous coating, DE 10010016 C1 proposes that a reaction chamber and a purging chamber be additionally provided in a vacuum chamber, wherein the reaction chamber may also be formed as a shield that is at the same potential as the substrate carrier or the electrode which is formed by the substrate carrier.

DE 39 18256 A1 proposes a shield in a PECVD method as well.

However, these prior art solutions have disadvantages in terms of a high constructive effort or other desired properties.

FIELD OF THE INVENTION

Object of the Invention

It is therefore the object of the present invention to provide an electrode arrangement for a coating device, and particularly a coating device for the PECVD deposition of layers, with which a homogeneous large-surface coating can be obtained, wherein the effort for the production of the corresponding devices and for the operation of these arrangements is simultaneously to be kept down.

Technical Solution

This object is achieved by means of an electrode arrangement with the characteristics of claim 1 and a coating device having the characteristics of claim 25. Advantageous embodiments are the subject matter of the dependent claims.

The present invention is based on the finding that, for an electrode arrangement for a coating device for effecting a PECVD coating, a homogeneous coating can be advantageously achieved if an electric shield is at least partly provided that ensures a favourable field or potential distribution. This electric shield shall according to the invention restrict the space between the electrodes in which a plasma for enhancing plasma-enhanced CVD-deposition is ignited, i.e. the plasma and/or coating space. Correspondingly, the electric shield is to be at least partly provided at one end face running transversely to the principal surfaces of the electrodes, with the electric shield capable of being provided at several end faces or around the electrode. For variable adjustment of the electric field or the potential distribution, the invention provides for at least one part of the shield to be formed such that it is movable. Particularly in the context of an electrode arrangement in which one electrode acting as substrate carrier is designed so as to be movable, this has the advantage of allowing corresponding adjustment to be effected simply.

Especially, a shield that is at least partially movable makes it possible for the electric shield to be connected to the movable electrode, i.e. the substrate carrier, via the movable part of the shield, such that the connection is electrically conducting and that the shield can be set at the same potential.

Since the movable electrode of the electrode arrangement is preferably set at earth potential, the shield can thus also be set at earth potential in a simple manner.

For the purpose of delimiting the plasma and/or coating space, the shield can project at least partially beyond the end face of an electrode, and be elongated in the direction of the counter-electrode. In addition, the shield can also project beyond the electrode in the opposite direction.

The shield may be formed completely or just partially from electrically conducting material, and additionally may be formed such that it is electrically non-conducting. This may be achieved, for example, by a corresponding coating with a non-conducting material or by a multi-part shield made of conducting and non-conducting components.

The non-conducting formation of the shield may be provided at the side facing the plasma and/or coating space between the electrodes in order that discharge of the electrically charged particles from the plasma via contact with the shield may be avoided.

The shield may also be formed of many parts such that several components overall constitute the shield.

For instance, a suction channel which is provided adjacent to an electrode and which serves to remove excess reaction products or reaction gases may be formed as part of the shield.

The at least partially movable formation of the shield may be realized by a movable contact element, which is movable transversely, especially perpendicularly to the principal surface(s) of the electrodes in order that, via a corresponding movement, it may make and then break contact with an electrode. In this way, especially, the contact element and thus the shield can come into contact with the movable electrode and the shield can short-circuit with the movable electrode, i.e. the substrate carrier, such that both are preferably set to earth potential. In the event that the shield surrounding the electrode arrangement is formed in the shape of a ring or frame, the movable contact element may also be formed in the shape of a ring or frame.

In order that a homogeneous temperature distribution may be adjusted on the electrode in addition to the advantageous potential distribution or the distribution of the electric field brought about by the shield provided, the fixed electrode, which is formed as a showerhead electrode for the purpose of uniformly distributing the reaction gases, may be preferably formed from several distribution plates, which are made from thermally conducting material and are in full-face contact with each other. By full-face here is meant that, with the exception of the indispensable distribution channels in the plates, no cavities, such as gas, mixing, or distribution chambers, are provided between the distribution plates. The effect of this corresponding full-face connection of the distribution plates is to ensure good thermal conductivity, such that good temperature equalization is possible in the electrode. In conjunction with an additional cooling and/or heating device, with which the temperature of the electrode can be adjusted and regulated or controlled, a homogeneous and defined temperature can be set at the electrode.

For the purpose of improving mutual thermal conduction between the distribution plates, thermal conduction elements may also be provided between the distribution plates, said elements capable of being distributed homogeneously across the interfaces of the distribution plates. Especially, the thermal conduction elements may be connecting elements, such as screws, rivets and the like, for connecting the distribution plates. Accordingly, these connecting elements can be made from thermally conducting material, such as corresponding metals.

BRIEF DESCRIPTION OF THE FIGURE

Further advantages, characteristics and features of the present invention are apparent from the following detailed description of an embodiment using the enclosed drawing. The drawing shows in purely schematic form a cross-sectional view of a part of a coating or vacuum chamber with an inventive electrode arrangement.

PREFERRED EMBODIMENT

The enclosed drawing shows a part of a vacuum chamber wall 1, which has an electrode opening 2, in which a first electrode 3 is inserted.

The electrode 3 is made up of several plates 4 to 6 and accommodated via a peripheral seal or insulation 11 in the electrode opening 2 of the vacuum chamber wall 1.

Opposite electrode 3 is a counter-electrode 18, which also serves as a substrate carrier for a substrate to be coated 17. Whereas the electrode 3 arranged in the chamber wall 1 is connected to a high frequency or ultra-high frequency (HF/UHF) voltage source 9, which ensures that the electrode 3 is in contact with a high potential, the counter electrode 18 is set to earth potential (not shown).

In accordance with the horizontal double arrow drawn, the substrate carrier or the counter electrode 18 may be moved or displaced parallel to the principal surfaces of the electrodes 3 and 18 in order that the substrate to be coated 17 may be arranged opposite the electrode 3 for the purpose of performing coating. The substrate 17 is transported via the substrate carrier or the counter-electrode 18 into the vacuum chamber and removed from it again or moved through the vacuum chamber. For example, the substrate carrier 18 may also serve to move the substrate successively into a multiplicity of coating chambers or coating stations as well as processing stations generally. In addition, by means of the substrate carrier 18, continuous coating can be performed, that is, coating in which the substrate is moved continuously, and not just static or stationary coating, that is, coating in which the substrate 17 does not move.

Due to the high-frequency potential, which is impressed on the electrode 3 by means of the HF/UHF voltage supply 9, a plasma can be ignited in the space between the electrode 3 and counter electrode 18, said plasma enhancing the deposition of materials on the substrate 17. The reactants are introduced into the vacuum chamber 1 in the form of gaseous substances (reaction gas) via a gas supply 7. The electrode 3 serves as a so-called showerhead electrode for distributing the gaseous substances that are introduced via the gas supply 7. To this end, the electrode has electrode plates 4 to 6 with distribution channels (not shown), which ensure distribution of the reaction gases across the electrode surface in order that uniform, homogeneous distribution of the reaction gases in the coating chamber 16 may be ensured. Although the gas supply 7 is shown with only one feed line and a valve 8 arranged therein, it goes without saying that the gas supply can have several feed lines with corresponding shut-off devices and the like, such as flow controllers, etc.

The electrode plates also designated as distribution plates 4 to 6 of the showerhead electrode 3 are formed such that a uniform distribution of the supplied gas is ensured during distribution to a multiplicity of outlet openings (not shown) in the last distribution plate 6. To this end, a multiplicity of branching distribution channels is provided (not shown).

For the purpose of setting the electrode 3 to a controlled temperature, a cooling and/or heating device 10 is provided, by means of which temperature control, that is, heating and/or cooling of the electrode 3, is possible.

Since the electrode 3 is provided in the chamber wall 1 of the vacuum chamber, an arrangement of cooling/heating circuits and the like is possible without costly vacuum feedthroughs and the like.

To ensure homogeneous temperature distribution, the distribution plates 4 to 6 of the electrode 3 are designed to facilitate good thermal conduction. This is achieved by forming the distribution plates 4 to 6 on the one hand from a material of high thermal conductivity, such as from corresponding metallic materials, such as copper and the like. On the other hand, the design ensures that the transitions between the distribution plates, that is, the areas of the interfaces of the abutting surfaces of the distribution plates 4 to 6 are arranged such that good heat conduction occurs. This may be achieved on one hand by dispensing with cavities as much as possible, with the exception of the distribution channels, such that contacting of plate material is as full-face as possible. On the other hand, thermal conduction elements, not shown in any further detail, are provided between the individual plates 4 to 6 to ensure good heat transfer. For instance, the thermal conduction elements may be formed by corresponding connecting elements, such as screws, rivets and the like.

The seal or insulation 11 provided at the vacuum chamber wall opening 2 serves both to achieve a vacuum-tight arrangement of the electrode 3 in the electrode opening 2 and electric insulation of the electrode 3 relative to the vacuum chamber wall 1, which is also set to earth potential.

In the region of the end faces of the electrode 3, a peripheral ring element 12 is provided as part of an electric shield, with the ring element 12 also electrically insulated from the electrode 3 or the adjacent distribution plates 5 and 6 via the electric insulation 11. Ring element 12 may be a circular element or any circumferential frame with arbitrary form, for example a rectangular or generally polygonal frame.

The electric shield 12, which is constructed at least partially from electrically conducting material, serves to achieve an advantageous potential distribution in the plasma or coating space 16 and at the substrate 17. The shield comprises, in addition to the ring element 12 in direct contact with the insulation 11 of the electrode 3, a part of the suction channel wall 19 of a suction channel 13, which is also provided peripherally about the electrode 3 at the vacuum chamber 1. Moreover, the shield comprises a movable contact element 14, which is movably connected to the suction channel wall 19, more precisely movable, as shown by the double arrows, in the direction of the substrate 18 and away from it. The contact element 14, on the left side of the drawing, is shown in contact with the substrate carrier 18, while, on the right side of the drawing, the contact element 14 is shown in a retracted position spaced apart from the substrate carrier 18. However, this is only shown this way for illustrative purposes. Of course, in reality, the parts of the contact element 14 shown in the drawing move synchronously, since they are preferably formed as a frame or ring element about or around the electrode 3. Through the shield consisting of the ring element 12, part of the suction channel wall 19 and the contact element 14, which contacts the counter-electrode 18 or the substrate carrier 18 and short-circuits the counter electrode 18 with the vacuum chamber wall 1, the chamber wall 1 and the shield consisting of the ring element 12, suction channel wall 19 and contact element 14 as well as the substrate carrier 18 can all be set to earth potential. This yields an advantageous potential distribution in the coating and/or plasma space 16 and on the substrate 17.

In order that direct electric contact may be prevented between the electric shield and the plasma space 16, the side of the shield facing the plasma space can be provided with an electrically insulating material in the form of a coating, lining or any other multi-part design, such that charge carriers in the plasma space 16 are not discharged directly via the shield, but that only an advantageous potential distribution or field distribution occurs in and around the plasma space 16. This effects a particularly uniform coating, especially for large-surface substrates 17.

The already mentioned suction channel 13, which is arranged around the electrode 3, is used for extracting excess reaction gases and products, which can be removed from the vacuum chamber via an opening 20. The suction opening 20 is, of course, also sealable, although this is not shown in the schematic illustration of the drawing.

The annular suction channel 13 also has an annular suction opening 15 about the electrode 3, said opening facing, at the end face of the electrode 3, facing the plasma or coating space 16.

By means of the described electrode arrangement, a coating device in which the electrode arrangement is realized that can perform plasma-enhanced chemical vapour phase deposition (PECVD), in which, through the special potential or field distribution of the electric field, the homogeneous temperature setting of the electrode 3 and the uniform gas supply via the showerhead electrode 3, homogenous coating even of large-surface substrates 17 can be performed.

Although the present invention based on the example illustrated has been described in detail, it is apparent to a person skilled in the art, of course, that the invention is not restricted to this embodiment, but rather that changes and modifications, particularly a different combination of the individual features depicted, and the exclusion of certain features, may be made without departing from the protective scope of the accompanying claims.

The invention claimed is:

1. An electrode arrangement for a coating device comprising:
   a stationary first electrode and a movable second electrode, whose principal surfaces are opposite each other during coating, wherein the second electrode may be moved along a plane parallel to the opposing principal surface of the first electrode, and
   an electrical shield provided near at least one end face of an electrode, the end face running transversely relative to the principal surface, wherein the electrical shield extends at least partially parallel to the end face of one electrode, and wherein the electrical shield comprises a conductive movable contact element which is movable transversely toward the principal surface of the second electrode to make electrical contact with the second electrode, and movable transversely away from the principal surface of the second electrode to break electrical contact with the second electrode.

2. An electrode arrangement in accordance with claim 1, wherein the shield extends beyond the end face of the first electrode in the direction of the second electrode.

3. An electrode arrangement in accordance with claim 1, wherein the shield extends beyond the end face of the first electrode in the opposite direction of the second electrode.

4. An electrode arrangement in accordance with claim 1, wherein the shield is provided at two, three or all end faces.

5. An electrode arrangement in accordance with claim 1, wherein the shield at least partially surrounds a plasma and coating space provided between the electrodes.

6. Electrode arrangement in accordance with claim 1, wherein the shield is connected to at least one of the electrodes in an electrically conducting way and/or is set to earth potential.

7. An electrode arrangement in accordance with claim 1, wherein the shield is formed so as to be electrically non-conducting at a side facing a plasma and coating space provided between the electrodes.

8. An electrode arrangement in accordance with claim 1, wherein the shield is provided as part of a suction channel provided at least partially around at least one of an electrode and a plasma and coating space provided between the electrodes.

9. An electrode arrangement in accordance with claim 1, wherein the contact element can make and then break contact with the movable electrode.

10. An electrode arrangement in accordance with claim 1, wherein the contact element is formed in the shape of a ring surrounding at least one of an electrode and a plasma and coating space.

11. An electrode arrangement in accordance with claim 1, wherein the movable second electrode is a traveling substrate carrier.

12. An electrode arrangement in accordance with claim 1, wherein a suction channel is provided which is arranged around an electrode and has a circumferential inlet opening or a plurality of adjacent inlet openings, provided circumferentially.

13. An electrode arrangement in accordance with claim 12, wherein the normal of the inlet opening surface is essentially parallel to the principal surface of the electrodes.

14. An electrode arrangement in accordance with claim 12, wherein the inlet opening(s) is/are provided in the region of the end faces of the electrodes in a plane between the electrodes.

15. An electrode arrangement in accordance with claim 1, wherein one of the electrodes is a showerhead electrode.

16. An electrode arrangement in accordance with claim 1, wherein the first, stationary electrode is a showerhead electrode, wherein the showerhead electrode comprises several distribution plates which make full-face contact with each other and are formed from thermally conducting material.

17. An electrode arrangement in accordance with claim 16, wherein the distribution plates of the showerhead electrode are connected to thermally conducting elements distributed homogeneously over their surfaces.

18. An electrode arrangement in accordance with claim 17, wherein the thermally conducting elements comprise connecting elements of thermally conducting material, selected from a group consisting of screws, rivets and the like.

19. An electrode arrangement in accordance with claim 1, wherein at least one of a heating and cooling device for setting the temperature at an electrode is provided.

20. An electrode arrangement in accordance with claim 1, wherein a gas supply device is provided.

21. An electrode arrangement in accordance with claim 1, wherein one electrode is attached to at least one of a high-frequency and ultrahigh frequency voltage source and one electrode is at earth potential.

22. Coating device for application of plasma-enhanced chemical vapour phase deposition with an electrode arrangement in accordance with claim 1.

* * * * *